US008624768B2

(12) United States Patent
Tsai et al.

(10) Patent No.: US 8,624,768 B2
(45) Date of Patent: Jan. 7, 2014

(54) ZERO-CROSSING-BASED ANALOG-TO-DIGITAL CONVERTER HAVING CURRENT MISMATCH CORRECTION CAPABILITY

(75) Inventors: Tsung-Heng Tsai, Chiayi (TW); Pei-Jung Hsu, Taichung (TW); Bo-Yu Shiu, Taichung (TW)

(73) Assignee: National Chung Cheng University, Chia-Yi (TW)

( * ) Notice: Subject to any disclaimer, the term of this patent is extended or adjusted under 35 U.S.C. 154(b) by 0 days.

(21) Appl. No.: 13/566,655

(22) Filed: Aug. 3, 2012

(65) Prior Publication Data

US 2013/0201047 A1    Aug. 8, 2013

(30) Foreign Application Priority Data

Feb. 3, 2012  (TW) .............................. 101103625 A

(51) Int. Cl.
*H03M 1/12*    (2006.01)
(52) U.S. Cl.
USPC .......................................... 341/155; 341/161
(58) Field of Classification Search
USPC .......................................... 341/155, 161, 120
See application file for complete search history.

(56) References Cited

U.S. PATENT DOCUMENTS

| 6,617,992 B2 * | 9/2003 | Sakurai ......................... 341/161 |
| 6,891,486 B1 * | 5/2005 | Pentakota et al. ............. 341/120 |
| 7,233,276 B1 * | 6/2007 | Huang ........................... 341/163 |
| 8,031,092 B1 * | 10/2011 | Sun ............................... 341/120 |

OTHER PUBLICATIONS

Benjamin P Hershberg et al., A 1.4V Signal Swing Hybrid CLS-Opamp/ZCBC Pipelined ADC Using a 300mV Output Swing Opamp,IEEE ISSCC, Feb. 2010, pp. 302-304, Session 16.
John K. Fiorenza et al., Comparator-Based Switched-Capacitor Circuits for Scaled CMOS Technologies, IEEE Journal of Solid-State Circuits, Dec. 2006, pp. 2658-2668, vol. 41, No. 12.
Lane Brooks et al., A Zero-Crossing-Based 8-bit 200 MS/s Pipelined ADC, IEEE Journal of Solid-State Circuits, Dec. 2007, pp. 2677-2687, vol. 42, No. 12.
Lane Brooks et al., A 12b, 50 MS/s, Fully Differential Zero-Crossing Based Pipelined ADC, IEEE Journal of Solid-State Circuits, Dec. 2009, pp. 3329-3343, vol. 44, No. 12.
Imran Ahmed et al., A Low-Power Capacitive Charge Pump Based Pipelined ADC, IEEE Journal of Solid-State Circuits, May 2010, pp. 1016-1027, vol. 45, No. 5.
Pei-Jung Hsu et al., A 12b 100MS/s Low-Power Zero-Crossing-Based ADC with Current Mismatch Corrections, VLSI Design/CAD Symposium, Aug. 5, 2011, 4 pages.

* cited by examiner

*Primary Examiner* — Brian Young
(74) *Attorney, Agent, or Firm* — Muncy, Geissler, Olds & Lowe, PLLC

(57) ABSTRACT

A zero-crossing-based analog-to-digital converter having current mismatch correction capability, that can raise resolution, energy efficiency, and sampling rate of a fully differential zero-crossing circuit, is realized through a 90 nm CMOS technology. The circuit is used mainly to correct offset error, to use a current supply separation technology and a digital correction mechanism to correct mismatch among a plurality of current supplies.

4 Claims, 10 Drawing Sheets

ZERO-CROSSING-BASED
ANALOG-TO-DIGITAL CONVERTER
HAVING CURRENT MISMATCH
CORRECTION CAPABILITY

BACKGROUND OF THE INVENTION

1. Field of the Invention

The present invention relates to an analog-to-digital converter, and in particular to a zero-crossing-based analog-to-digital converter having current mismatch correction capability.

2. The Prior Arts

In circuit designs, a negative feedback operation amplifier circuit having high gain, fast response speed, and small and steady current, is often used to realize a pipeline circuit of high resolution, fast sample rate, and low power consumption. However, with the CMOS specification requiring reduction in size, increased elements per unit area of chip, and low operation voltage, it has become increasingly difficult to use an operation amplifier to design a switching capacitor circuit convenient to use, to achieve high gain and large output amplitude slew, while maintaining its stability.

In this respect, a zero-crossing-based pipeline analog-to-digital conversion circuit was proposed in 2007, to replace the operation amplifier required in the conventional design. The basic concept of this design is to use a comparator detecting pseudo short circuit and a constant current supply, to replace the operation amplifier, that utilizes negative feedback to force a pseudo short circuit. The original type of this design is a single end pipeline analog-to-digital conversion circuit, to achieve a sampling rate of $2 \times 10^8$ times per second. Further, in order to reduce noises of voltage supply and the substrate, a zero-crossing-based fully differential pipeline analog-to-digital conversion circuit was proposed in 2009, that can achieve a sampling rate of $5 \times 10^7$ times per second.

However, the mismatch between the Zero Crossing Detector (ZCD) and the current supply could lead to the problem of distortion. The reason for this is that, the intrinsic non-zero time delay existing in the Zero Crossing Detector (ZCD) could cause over-charge, to produce offset error in pipeline circuit stage, that could result in saturation distortion when a multiplying digital-to-analog conversion circuit (MDAC) outputs it remainder.

Therefore, presently, the design and performance of zero-crossing-based analog-to-digital conversion circuit of the prior art is not quite satisfactory, and it has much room for improvements.

SUMMARY OF THE INVENTION

In view of the problems and shortcomings of the prior art, the present invention provides a zero-crossing-based analog-to-digital converter having current mismatch correction capability, to solve the errors and distortions of the analog-to-digital converter of the prior art.

According to one embodiment of the present invention, a zero-crossing-based analog-to-digital converter having current mismatch correction capability is composed of a $k^{th}$ stage pipeline circuit and a $(k+1)^{th}$ stage pipeline circuit. In this embodiment, the analog-to-digital converter includes a sub-analog-to-digital converter, a current supply branch circuit, a current mismatch correction circuit, and a zero-crossing detector circuit.

The sub-analog-to-digital converter is located in the $k^{th}$ stage pipeline circuit, and relative to the sampling range step, it is designed with two comparators to handle respectively the maximum range step and the minimum range step, to avoid saturation distortion. The current supply branch circuit is disposed across the $k^{th}$ stage pipeline circuit and the $(k+1)^{th}$ stage pipeline circuit, and is provided with current supplies at two ends of the current control switches in various parts of the $k^{th}$ stage) pipeline circuit and the $(k+1)^{th}$ stage pipeline circuit, to eliminate the signal dependence of voltage variations of the current control switch. The current mismatch correction circuit is in the $k^{th}$ stage pipeline circuit, to provide at least two capacitors to use the current redistribution principle, to eliminate the mismatch between the PMOS current supply and the NMOS current supply in the $k^{th}$ stage pipeline circuit. Finally, the zero-crossing detector circuit is located in the $k^{th}$ stage pipeline circuit, to detect the pseudo short circuit, when the switching signal in the $k^{th}$ stage pipeline circuit crosses zero.

To be more specific, in other embodiments of the present invention, the current mismatch correction circuit can be designed in the $(k+1)^{th}$ stage pipeline circuit, to provide at least two capacitors to use the current redistribution principle to eliminate the mismatch between the PMOS current supply and the NMOS current supply in the $(k+1)^{th}$ stage pipeline circuit. On the other hand, the zero-crossing detector circuit can be composed of a pre-amplifier and a dynamic threshold detecting latch. Moreover, the current mismatch correction circuit can be composed of a self-regulating filter, a digital control circuit, and a programmable current supply.

Through the application of the zero-crossing-based analog-to-digital converter having current mismatch correction capability, the resolution, energy efficiency, and sampling rate of the fully differential zero-crossing-based circuit can be raised. The zero-crossing-based analog-to-digital converter having current mismatch correction capability is mainly used to correct the offset errors, and it utilizes a current supply separation technique and a digital correction mechanism to correct mismatch among a plurality of current supplies.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

BRIEF DESCRIPTION OF THE DRAWINGS

The related drawings in connection with the detailed description of the present invention to be made later are described briefly as follows, in which.

DETAILED DESCRIPTION OF THE PREFERRED EMBODIMENT

The purpose, construction, features, functions and advantages of the present invention can be appreciated and understood more thoroughly through the following detailed description with reference to the attached drawings. And, in the following, various embodiments are described in explaining the technical characteristics of the present invention.

Figure 1:
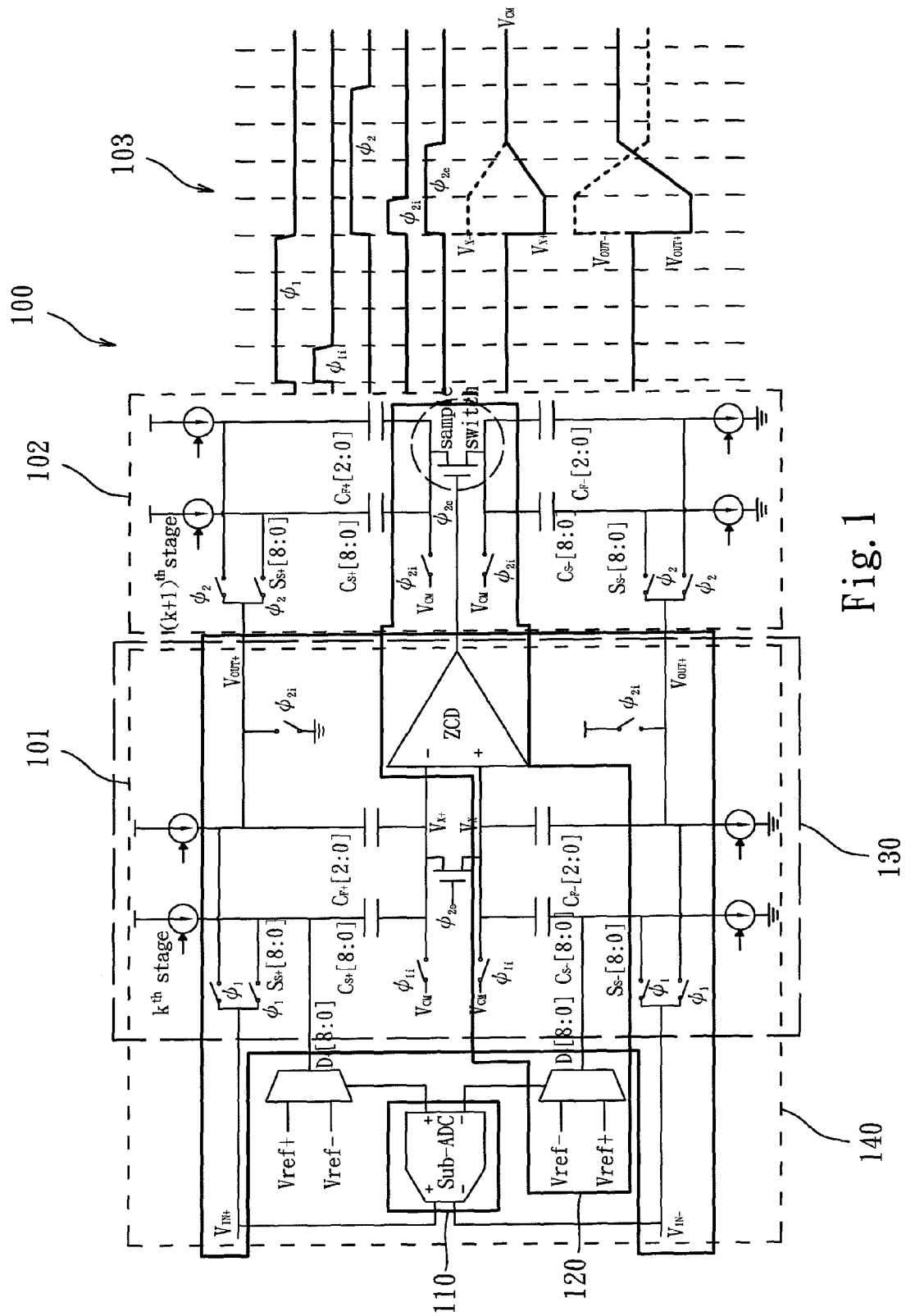
FIG. 1 is a circuit diagram of an analog-to-digital converter according to an embodiment of the present invention.

The present invention provides a zero-crossing-based analog-to-digital converter having current mismatch correction capability. As shown in FIG. 1, the analog-to-digital converter 100 of the present invention adopts a fully differential pipeline design, comprising at least: a $k^{th}$ stage pipeline circuit 101 (abbreviated as the $k^{th}$ stage circuit), and a $(k+1)^{th}$ stage pipeline circuit 102 (abbreviated as the $(k+1)^{th}$ stage circuit). Their relative actions are as shown in a time sequence diagram 103. It has to be noted that, according to the circuit design of the present invention, the analog-to-digital converter 100 can be designed to include: a sub-analog-to-digital converter 110, a current supply branch circuit 120, a current mismatch correction circuit 130, and a zero-crossing detector circuit 140, and that will be described in detail later.

On the whole, when signal φ1 is at high voltage, and the $k^{th}$ stage circuit 101 in a sample phase, the input signal is sampled by capacitor $C_{S\pm}$, and capacitor $C_{F\pm}$ in the $k^{th}$ stage circuit 101. When signal φ2 is at high voltage, and the $k^{th}$ stage circuit 101 is in a transmission phase, then the $(k+1)^{th}$ stage circuit 102 is in a sample phase, and the capacitor $C_{S\pm}$ and capacitor $C_{F\pm}$ in the $(k+1)^{th}$ stage circuit 102 become loads of the $k^{th}$ stage circuit 101. In the transmission phase, $C_{F\pm}$ is connected to the load, the capacitor $C_{S\pm}$ is connected to an analog multiplexer (MUX), and that is controlled by a sub-analog-to-digital converter (ADC) 110, to select the corresponding DC signal. At this time, all the charges in the capacitor $C_{S\pm}$ are transferred to capacitor $C_{F\pm}$, to produce the voltage gain required at output terminal.

Before charging the output terminal and raise its voltage, the voltage of signal φ2i increases, and the positive output voltage $V_{OUT+}$ is initialized to ground, while the negative output voltage $V_{OUT-}$ is initialized to power supply voltage $V_{DD}$. On the other hand, in the $(k+1)^{th}$ stage circuit 102, the bottom plate of the output load capacitors $C_{S\pm}$ and $C_{F\pm}$ are initialized to a common mode voltage $V_{CM}$. Upon completing the pre-charging phase, the current supply starts to charge the output terminal, so that the positive channel signal will rise with a slope, while the negative channel signal will drop with a slope. Besides, only the respective sampling switches can be connected electrically to the bottom plates of the positive and negative load capacitors $C_{S\pm}$ and $C_{F\pm}$.

The output of the zero-crossing detector circuit 140 is switched when detecting pseudo short circuit ($V_{X+}=V_-$). In such a design, an ordinary sub-analog-to-digital converter includes: 6 pipeline circuit stages of 2.8 bits based on 4, and a flash temporary storage circuit stage of the last bit. In the following, we are going to describe the errors of this kind of circuit in its original design of the prior art, including offset errors and mismatch of current supplies, and their remedies, then describe in detail functions and operations of the sub-analog-to-digital converter 110, the current supply branch circuit 120, the current mismatch correction circuit 130, and the zero-crossing detector circuit 140.

Sub-analog-to-digital Converter 110

Figure 2:
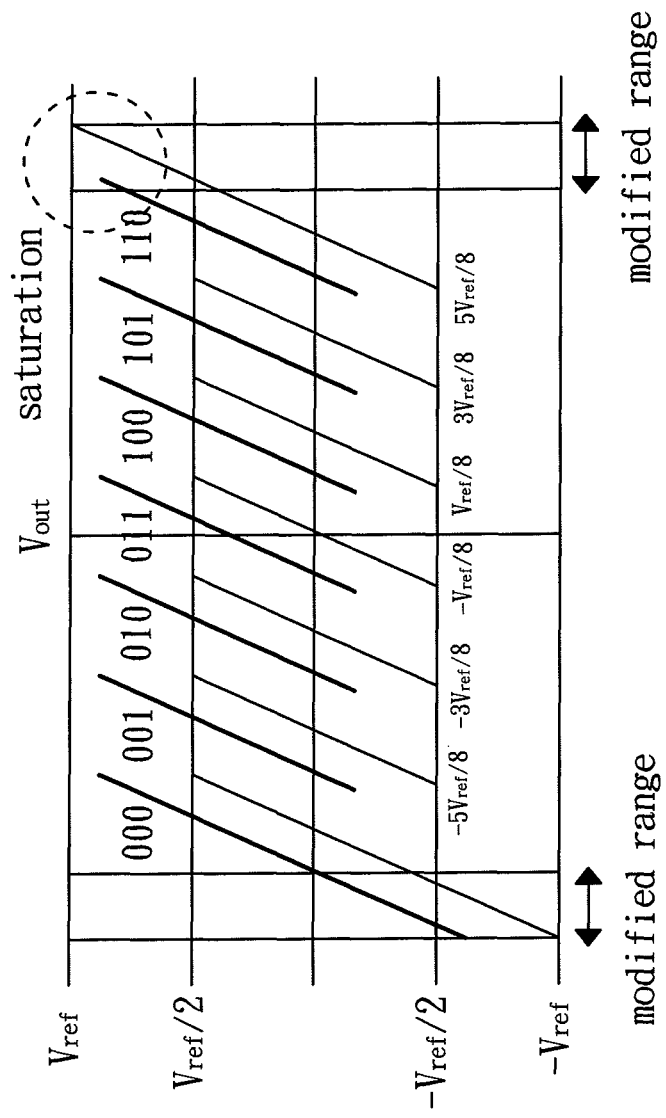
FIG. 2 is a signal waveform diagram of a sub-analog-to-digital converter according to the prior art.

Refer to FIG. 2 for a signal waveform diagram of a sub-analog-to-digital converter according to the prior art. Wherein, it shows that when an over-charging occurs, it will produce offset errors. The overcharging problem has become a common deficiency for various zero-crossing-based circuits (ZCBC). Presently, various technologies to modify over-charging are subject to the restrictions of limited accuracy. It is worth to note that, the occurrence of over-charging will lead to saturation distortion in the output of MDAC, thus reducing resolution of the entire analog-to-digital converter (ADC).

Figure 3:
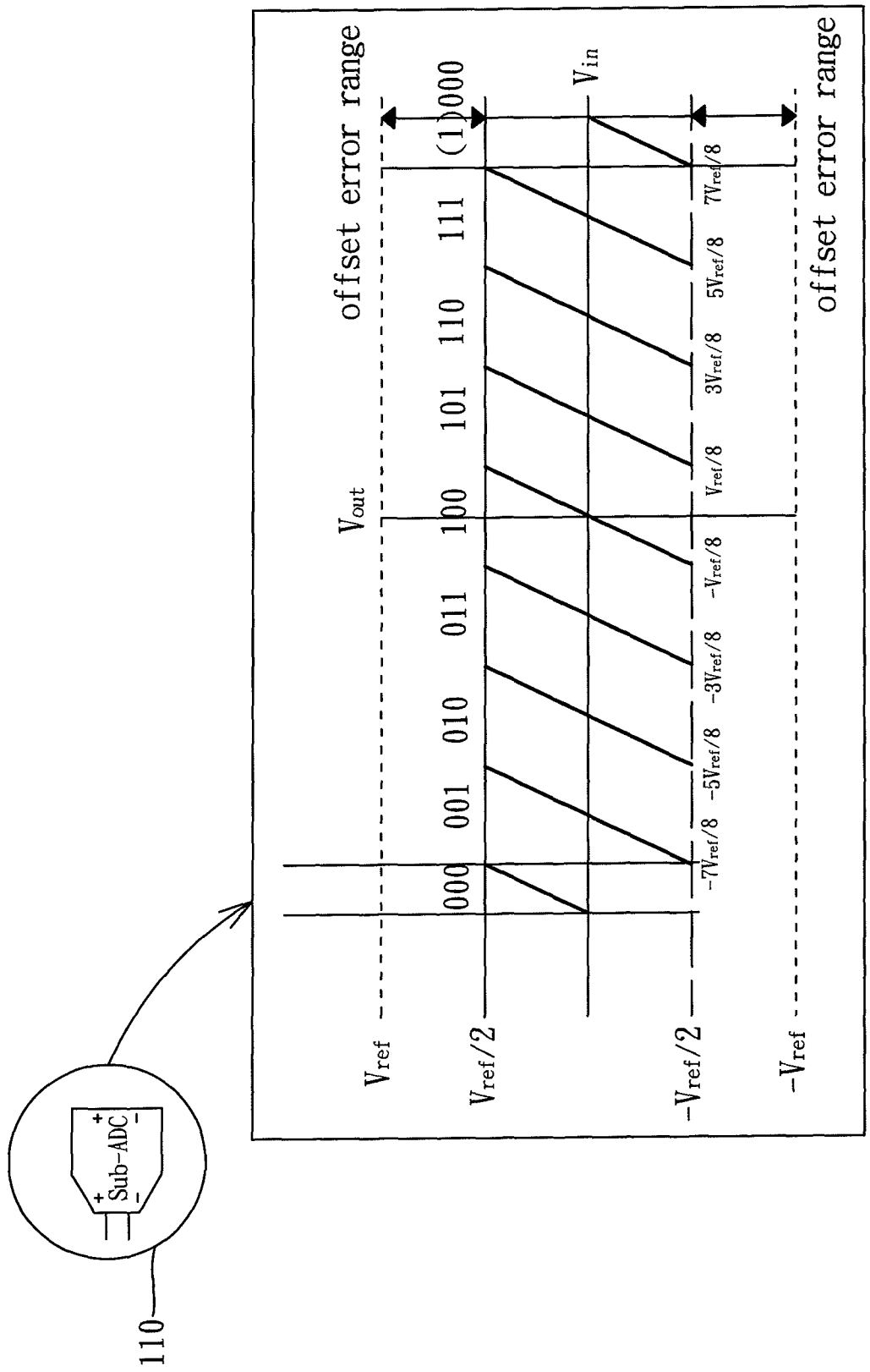
FIG. 3 is a signal waveform diagram of the sub-analog-to-digital converter of FIG. 1 according to an embodiment of the present invention.

Therefore, the sub-analog-to-digital converter 110 provides a technology to modify offset error, to avoid saturation distortion. Refer to FIG. 3 for a signal waveform diagram of the sub-analog-to-digital converter 110 of FIG. 1 according to an embodiment of the present invention. Wherein, it shows that the remainder of MDAC is modified to eliminate offset errors. More specifically, compared with the prior art, for the sub-analog-to-digital converter 110 of FIG. 3, two comparators are added to process signals of $\pm 7V_{ref}/8$. Moreover, this kind of approach can be used for the application of MDAC, to add two effective horizontal regions.

In other words, through adding two comparators to the sub-analog-to-digital converter 110 to process signals at two ends of its range, the overall dynamic ranges can be increased, to avoid the saturation distortion caused by the additional offset errors. Furthermore, when the offset amount is less than $\pm V_{ref}/2$, it is not required to make any corrections. Since for such a little offset, it will not cause saturation distortion.

Current Supply Branch Circuit 120

Figure 4:
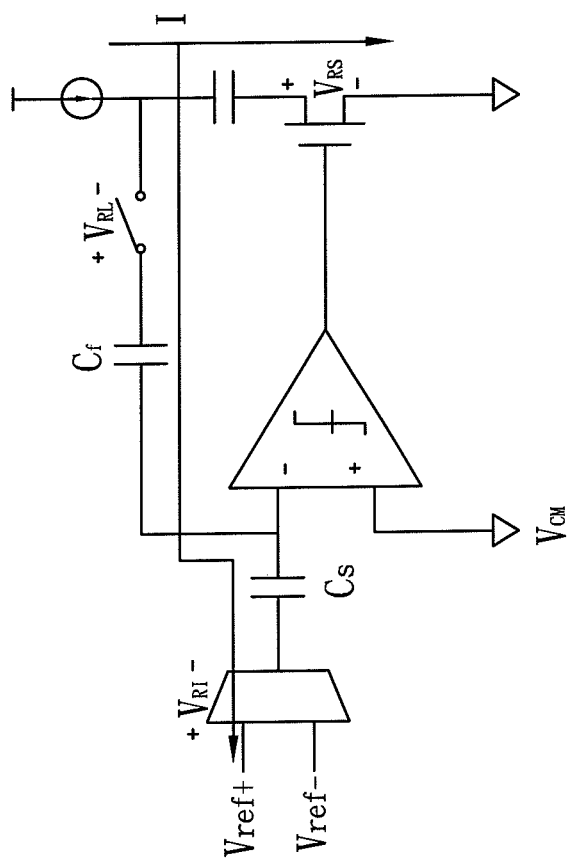
FIG. 4 is a circuit diagram of a current supply of a ZCBC pipeline circuit stage according to the prior art.

In performing switching each time, a constant current will flow through the switch, to produce a waveform of decreasing voltage with a zero-crossing resistor. At this time, refer to FIG. 4 for a circuit diagram of a current supply of a ZCBC pipeline circuit stage according to the prior art. Wherein, it shows that in the transfer of signals, namely when the switch is switched, and when the waveform of decreasing voltage occurs, the ZCBC pipeline circuit stage will produce an output voltage error $V_{Oe}$, as follows:

$$V_{Oe} = \frac{Cs}{Cf} V_{RI} + V_{RL} + V_{RS} \qquad (1)$$

Wherein voltages $V_{RI}$, $V_{RL}$, and $V_{RS}$ are voltage drops of an input analog multiplexer, current control switch, and sampling switch respectively.

Since the sampling switch and analog multiplexer are both connected electrically to the DC voltage supply, so voltages $V_{RS}$ and $V_{RI}$ are constant type errors. In addition, similar to the offset error mentioned above, when the voltage drop is less than $\pm V_{ref}/2$, voltages $V_{RS}$ and $V_{RI}$ can be controlled through the design mentioned above. However, since the current control switch connected in series with the capacitor Cf output load, is not connected to a DC voltage, so that the resistances of the entire series connection can be varied along with output voltage. In other words, voltage $V_{RL}$ has a signal dependent error, that could produce non-linier distortion. To this kind of non-linier error, the current supply branch circuit 120 can be applied.

Figure 5:
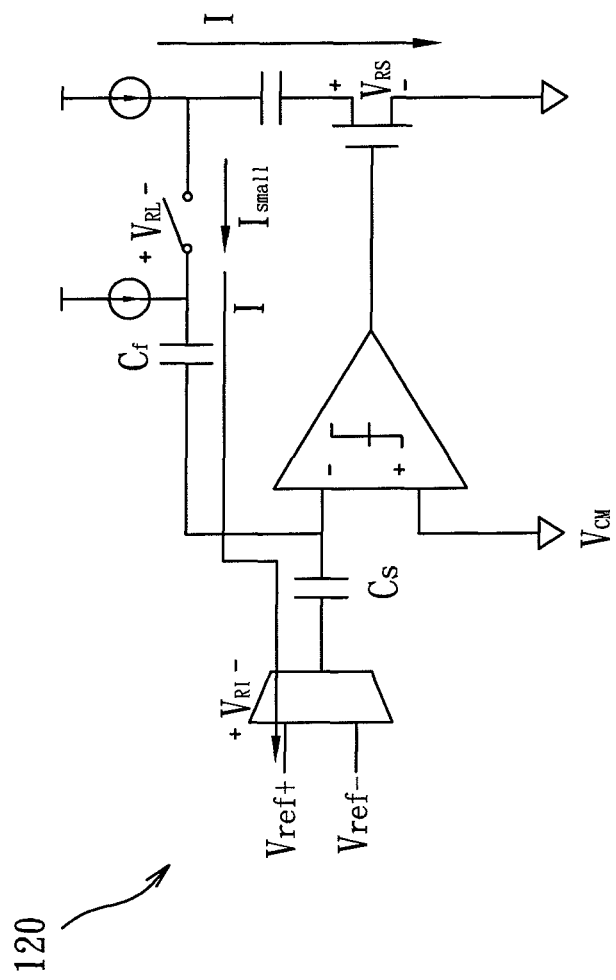
FIG. 5 is a circuit diagram of a current supply branch circuit of FIG. 1 according to an embodiment of the present invention.

Refer to FIG. 5 for a circuit diagram of a current supply branch circuit 120 of FIG. 1 according to an embodiment of the present invention. Wherein, a single current supply is divided into two current supplies, to charge capacitor Cf and load separately. Therefore, the current flowing through series-connected current control switches is reduced, so the corresponding voltage drop is decreased evidently. In addition, the conduction voltage of the current control switch can be used to produce constant voltage $V_{gs}$ by means of a voltage boosting technology.

Current Mismatch Correction Circuit 130

In order to realize operations of fully differential ZCBC design, two current supplies are required to charge positive channel circuit and discharge negative channel circuit. Therefore, a PMOS cascaded current supply is used to boost the voltage, while an NMOS cascaded current supply is used to drop the voltage. However, PMOS current supply and NMOS current supply are not matched to each other, due to variations of Process/Voltage/Temperature (PVT). In consideration of this kind of mismatch, the transfer function of ZCBC gain stage is as follows:

$$V_o = \frac{2SR}{2SR + \Delta SR}\left(\frac{Cs+Cf}{Cf}(V_I) - \frac{Cs}{Cf}(V_{ref})\right) - \frac{2\Delta SR}{2SR + \Delta SR}VCM \quad (2)$$

Wherein, $$\frac{2SR}{2SR + \Delta SR}$$

is a gain error, $$\frac{2\Delta SR}{2SR + \Delta SR}VCM$$

is offset error, SR is the slew rate of PMOS current supply and positive load, and $\Delta SR$ is a mismatch between two current supplies. As shown in the equation above, the mismatch of current supplies not only leads to gain error of the transfer function, but it also produces offset errors.

Of course, as mentioned earlier, if offset error is less than $\pm V_{ref}/2$, then it is not required to make any corrections. However, the gain error must be corrected, to prevent it from reducing the resolution of the entire ADC. Therefore, the design concept of the current mismatch correction circuit 130 is used to overcome the gain error.

Figure 6A:
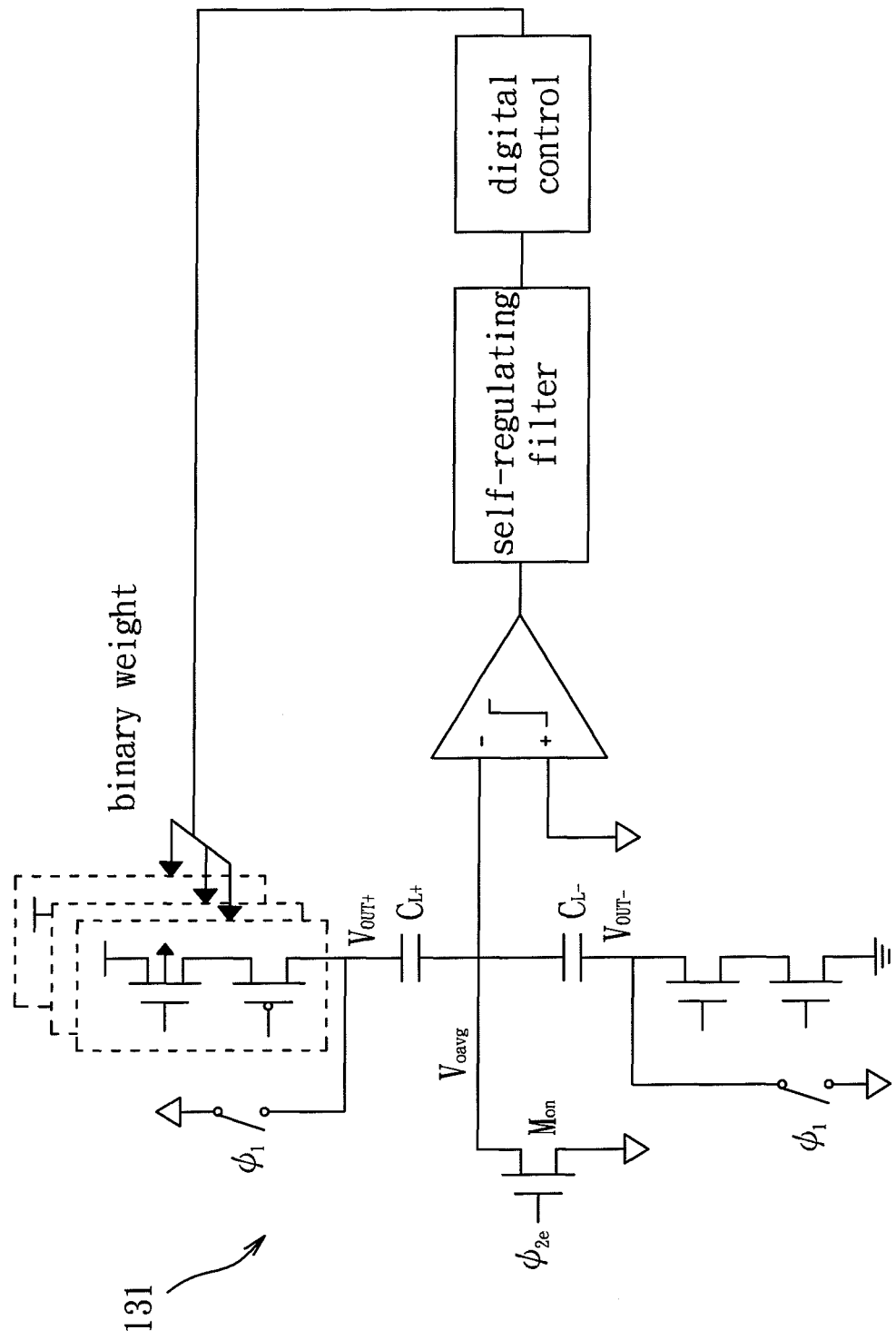
FIG. 6A is a circuit diagram of a current mismatch correction circuit of FIG. 1 according to an embodiment of the present invention.

Subsequently, refer to FIG. 6A for a circuit diagram of a current mismatch correction circuit 130 of FIG. 1 according to an embodiment of the present invention. As shown in FIG. 6A, the operation of the current mismatch correction circuit 130 is as follows. When the voltage of the signal φ2 is high, the remainder of the MDAC differential output is stored respectively in capacitor $C_{L+}$ and capacitor $C_{L-}$. When the voltage of the signal φ1 is high, the positive output voltage $V_{out+}$ and negative output voltage $V_{out-}$ are connected electrically to a common mode voltage $V_{CM}$. Then, according to a charge redistribution principle, an average voltage $V_{OAVG}$ will appear in capacitor $C_{L+}$ and capacitor $C_{L-}$. Afterwards, the average voltage $V_{OAVG}$ is compared with the common mode voltage $V_{CM}$, and a comparator will send out '1' or '0' to a self-regulating filter based on the results of the comparison. The self-regulating filter works in cooperation with the digital control functional block, to adjust the binary weight of the PMOS current supply. To be more specific, when the average voltage $V_{OAVG}$ is greater then the common mode voltage $V_{CM}$, the comparator will output '1'. At this time, the current at output terminal will increase correspondingly, until the current mismatch is corrected.

Figure 6B:
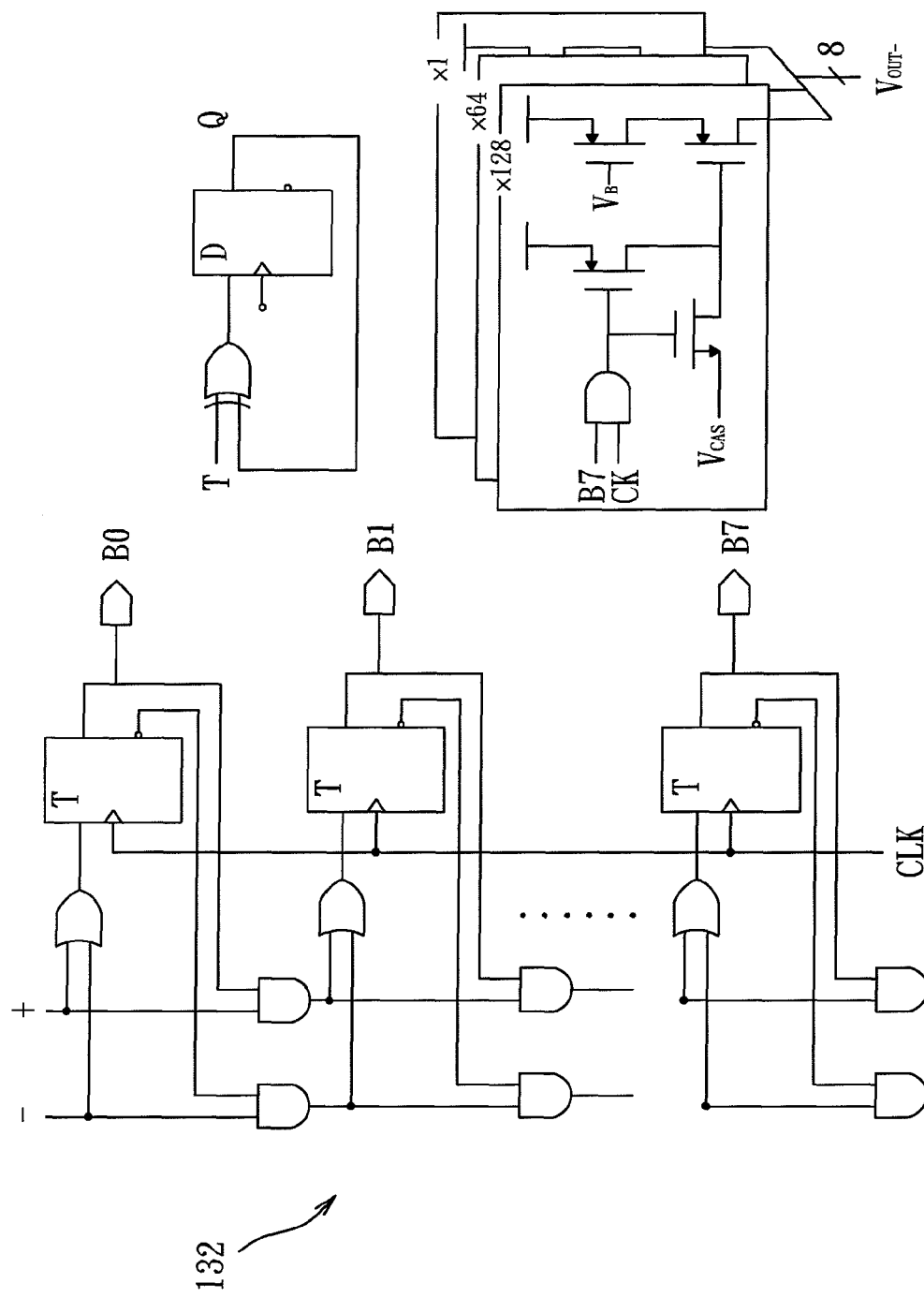
FIG. 6B shows circuit diagrams of a self-regulating filter, digital control circuit, and a programmable PMOS current supply according to an embodiment of the present invention.

Furthermore, for a complete understanding of the operation, refer to FIG. 6B for circuit diagrams of a self-regulating filter, digital control circuit, and a programmable PMOS current supply according to an embodiment of the present invention. The detailed structure of these circuits will not be repeated here for brevity. People familiar with this technology is able to realize the self-regulating filter, the digital control circuit, and the programmable PMOS current supply based on the contents shown in FIG. 6B.

Zero-crossing Detector Circuit 140

Figure 7:
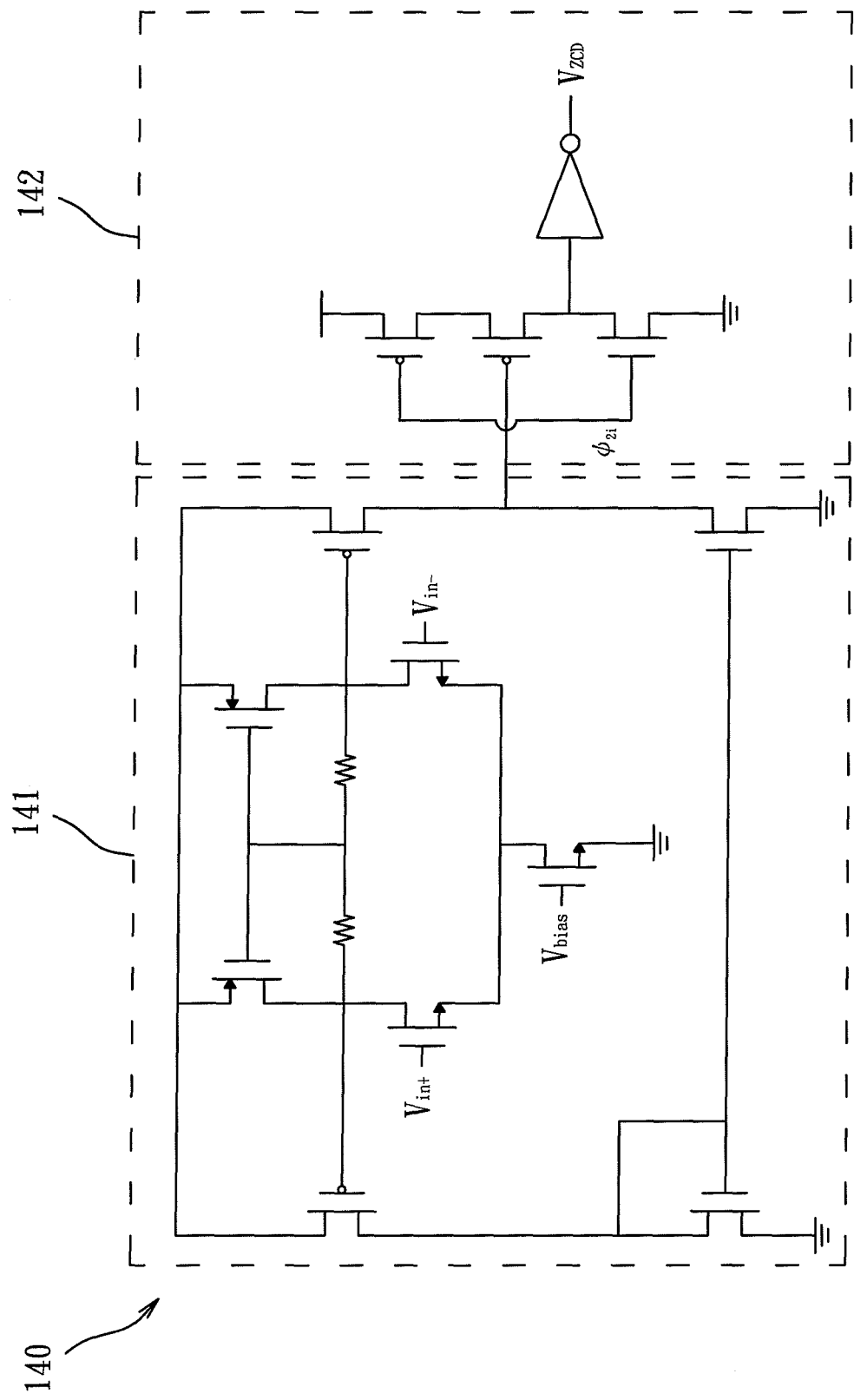
FIG. 7 is a circuit diagram of a zero-crossing detection circuit of FIG. 1 according to an embodiment of the present invention.

Refer to. FIG. 7 for a circuit diagram of a zero-crossing detection circuit 140 of FIG. 1 according to an embodiment of the present invention. As shown in FIG. 7, the zero-crossing detection circuit 140 is composed of a pre-amplifier 141, and a dynamic threshold detecting latch (DTDL) 142. The pre-amplifier 141 differentiates itself to the signal terminal. To be more specific, the pre-amplifier 141 is composed of an NMOS differential pair, diode-connected load, and a resistance Common Mode Feed Back (CMFB) circuit. The current mirror of the pre-amplifier 141 is used to convert the differential signal into a single output signal at the signal terminal.

Figure 8:
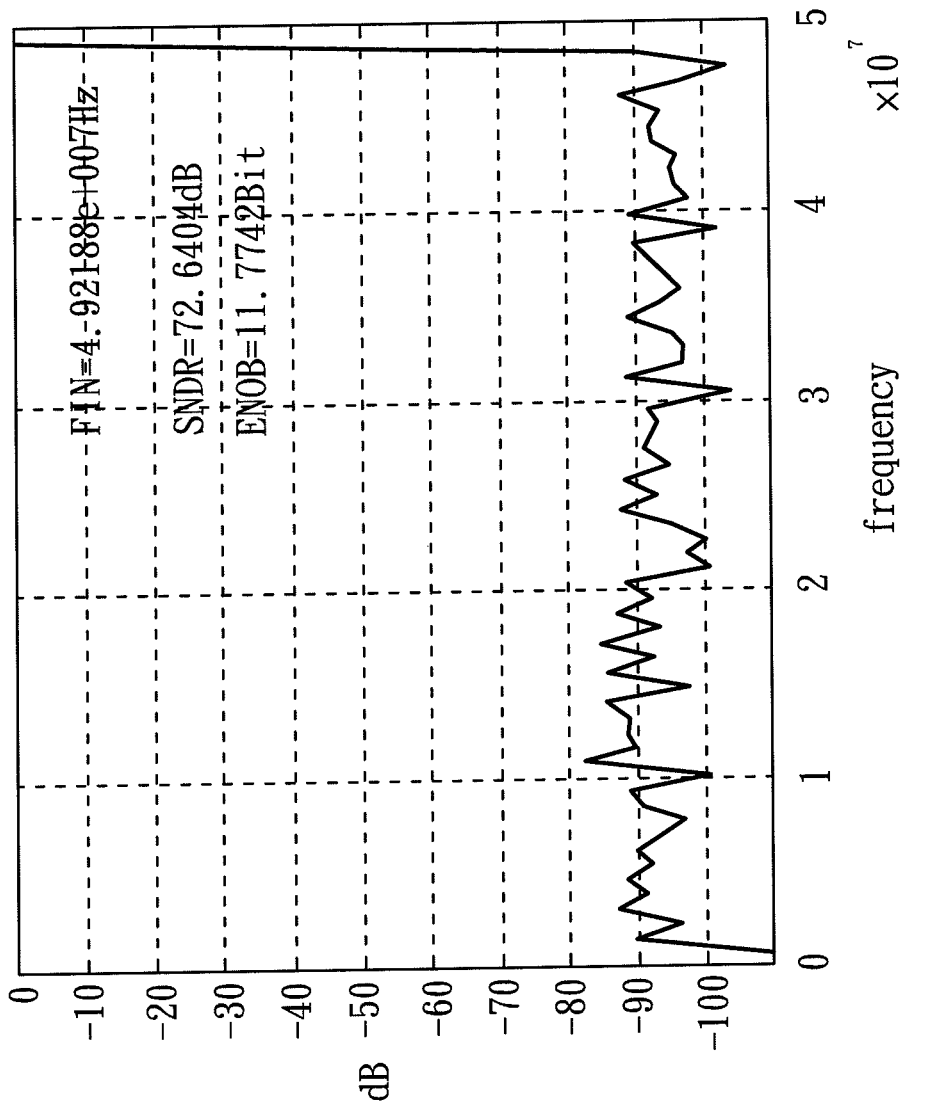
FIG. 8 is a signal-to-noise ratio (SNR) simulation waveform diagram of the analog-to-digital converter of FIG. 1 according to an embodiment of the present invention.
Figure 9:
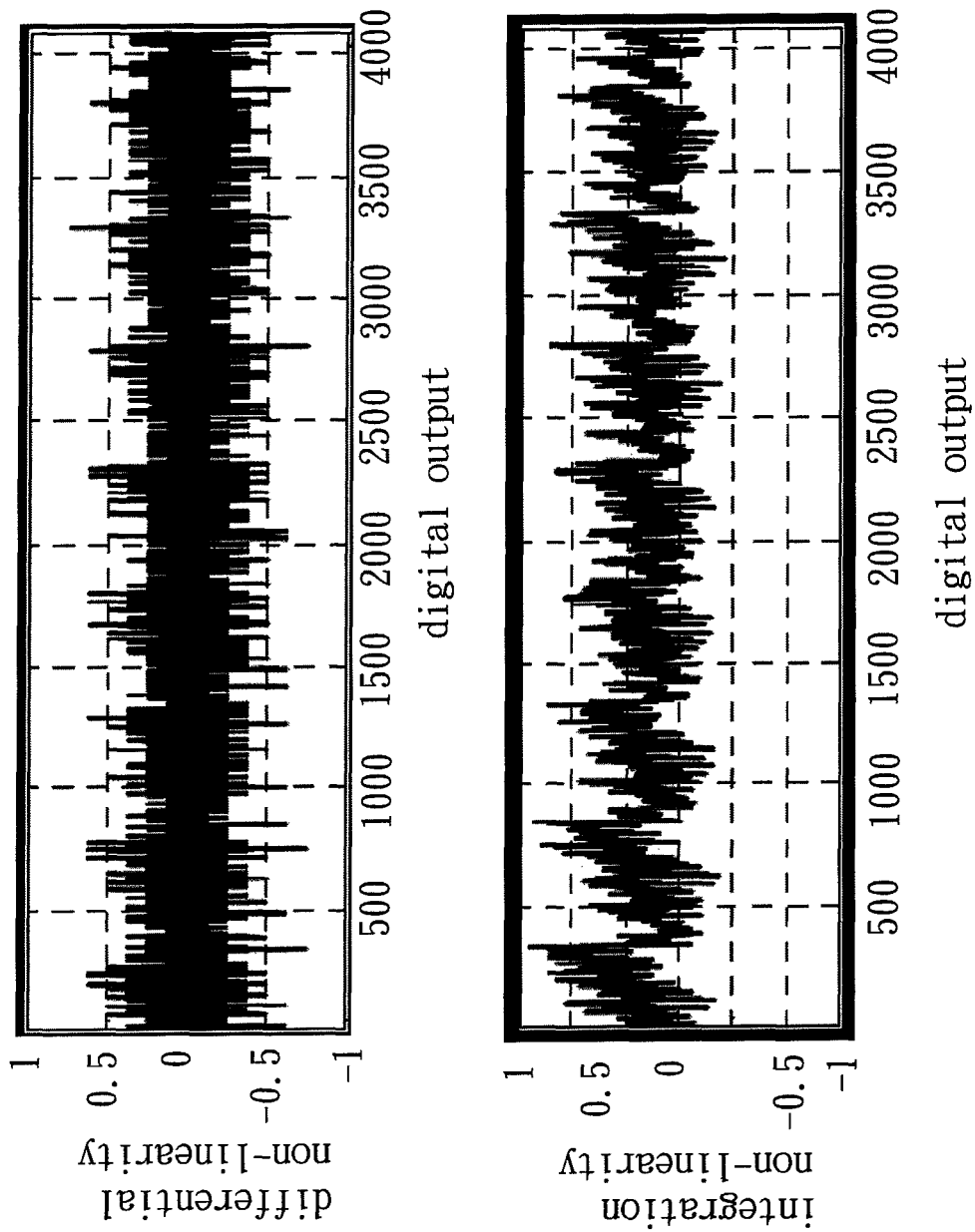
FIG. 9 shows a differential nonlinear and integration nonlinear simulation waveform diagram of the analog-to-digital converter of FIG. 1 according to an embodiment of the present invention.

Finally, in the production of an analog-to-digital converter 100 of the present invention, a 90 nm manufacturing process is used to produce a ZCBC pipeline ADC. Its test and simulation data are as follows:

The total area of the entire chip is 2.88 mm$^2$, and for 1.2V voltage supply, the total power consumption is 20.8 mW. In the condition of 100 MS/s, when performing sampling for input sine wave 49.2 MS/s, the ADC can reach peak value 72.64 dB of Signal to Noise plus Distortion Ratio (SNDR), as shown in the simulation waveform diagram of FIG. 8. In addition, the differential non-linearity (DNL) and integration non-linearity (INL) of ADC are 0.75 LSB and 1.4/-0.42 LSB, as shown in the simulation waveform diagram of FIG. 9.

In the following table is shown the comparisons of characteristics of ADC of the present invention and that of the cited documents.

|  | present invention | cited document 1 | cited document 2 | cited document 3 | cited document 4 |
| --- | --- | --- | --- | --- | --- |
| manufacturing technology | 90 nm CMOS | 90 nm CMOS | 65 nm CMOS | 0.18 um CMOS | 0.18 um CMOS |
| resolution | 12 bit | 12 bit | 10 bit | 10 bit | 14 bit |
| sample rate | 100 MS/s | 50 MS/s | 100 MS/s | 50 MS/s | 100 MS/s |

-continued

|  | present invention | cited document 1 | cited document 2 | cited document 3 | cited document 4 |
|---|---|---|---|---|---|
| SNDR | 72.6 dB | 62 dB | 59 dB | 58.2 dB | 70.5 dB |
| ENOB | 11.77 | 10 | 9.5 | 9.4 | 11.4 |
| Power consumption | 20.8 mW | 4.5 mW | 4.5 mW | 9.9 mW | 230 mW |
| $FOM = \dfrac{Power}{2^{ENOB} \times f_{in}}$ | 119 fJ/conv. | 196 fJ/conv. | 124 fJ/conv. | 293 fJ/conv. | 630 fJ/conv. |

Wherein, the cited document 1 is L. Brooks and H. S. Lee, "A 12b, 50 MS/s, fully differential zero crossing based pipelined ADC," IEEE J. Solid-State Circuit, vol. 44, no. 12, pp. 3329-3343, December 2009. The cited document 2 is M. Boulemnakher, E. Andre, J. Roux, and F. Paillardet, "A 1.2V 4.5 mW 10b 100 MS/s pipelined ADC in 65 nm CMOS", IEEE ISSCC Dig. Tech. Papers, February 2008, pp. 250-251. The cited document 3 is I. Ahmed, J. Mulder, and D. A. Johns, "A low-power capacitive charge pump based pipelined ADC", Journal of Solid State Circuits (JSSC), to appear May 2010. And The cited document 4 is B. G. Lee, B. M. Min, G. Manganaro, and J. W. Valvano, "A 14-b 100-MS/s pipelined ADC with a merged SHA and first MDAC," IEEE J. Solid-State Circuits, vol. 43, no. 12, pp. 2613-2619, December 2008.

The above detailed description of the preferred embodiment is intended to describe more clearly the characteristics and spirit of the present invention. However, the preferred embodiments disclosed above are not intended to be any restrictions to the scope of the present invention. Conversely, its purpose is to include the various changes and equivalent arrangements which are within the scope of the appended claims.

What is claimed is:

1. A zero-crossing-based analog-to-digital converter having current mismatch correction capability, composed of a $k^{th}$ stage pipeline circuit and a $(k+1)^{th}$ stage pipeline circuit, said zero-crossing-based analog-to-digital converter comprising:

a sub-analog-to-digital converter, located in said $k^{th}$ stage pipeline circuit, and relative to a sampling range step, it is provided with two comparators to handle respectively a maximum range step and a minimum range step, to avoid saturation distortion;

a current supply branch circuit, disposed across said $k^{th}$ stage pipeline circuit and said $(k+1)^{th}$ stage pipeline circuit, and is provided with current supplies at two ends of current control switches in various parts of said $k^{th}$ stage pipeline circuit and said $(k+1)^{th}$ stage pipeline circuit, to eliminate signal dependence of voltage variations of said current control switches;

at least one current mismatch correction circuit, located in said $k^{th}$ stage pipeline circuit, and is provided with at least two capacitors, to use a current redistribution principle to eliminate mismatch between a PMOS current supply an NMOS current supply in said $k^{th}$ stage pipeline circuit; and a zero-crossing detector circuit, located in said $k^{th}$ stage pipeline circuit to detect pseudo short circuit, when a switching signal in said $k^{th}$ stage pipeline circuit crosses zero.

2. The zero-crossing-based analog-to-digital converter having current mismatch correction capability as claimed in claim 1, further comprising:

another said current mismatch correction circuit, located in said $(k+1)^{th}$ stage pipeline circuit, to be provided with said at least two capacitors to use said current redistribution principle to eliminate mismatch between said PMOS current supply and said NMOS current supply in said $(k+1)^{th}$ stage pipeline circuit.

3. The zero-crossing-based analog-to-digital converter having current mismatch correction capability as claimed in claim 1, wherein said zero-crossing detector circuit is composed of a pre-amplifier and a dynamic threshold detecting latch (DTDL).

4. The zero-crossing-based analog-to-digital converter having current mismatch correction capability as claimed in claim 1, wherein said current mismatch correction circuit is composed of a self-regulating filter, a digital control circuit, and a programmable current supply.

* * * * *